United States Patent
Kramer et al.

(10) Patent No.: US 9,425,808 B1
(45) Date of Patent: Aug. 23, 2016

(54) FREQUENCY DETECTOR

(71) Applicant: Texas Instruments Incorporated, Dallas, TX (US)

(72) Inventors: Bradley Allen Kramer, Plano, TX (US); Swaminathan Sankaran, Plano, TX (US); Hassan Ali, Murphy, TX (US); Nirmal C. Warke, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/732,300

(22) Filed: Jun. 5, 2015

(51) Int. Cl.
*H03L 7/06* (2006.01)
*H03L 7/085* (2006.01)
*H03L 7/099* (2006.01)

(52) U.S. Cl.
CPC ............... *H03L 7/085* (2013.01); *H03L 7/099* (2013.01)

(58) Field of Classification Search
USPC .................. 327/147–149, 156–158
See application file for complete search history.

(56) References Cited

U.S. PATENT DOCUMENTS

| | | | | |
|---|---|---|---|---|
| 4,349,785 A * | 9/1982 | Lemoussu | ............. | H04L 27/066 329/357 |
| 4,823,399 A * | 4/1989 | George | .................. | H03D 3/242 331/22 |
| 6,825,800 B1 * | 11/2004 | Dudley | .................... | G01S 7/282 342/194 |
| 2001/0003442 A1 * | 6/2001 | Smith | ....................... | H04B 7/10 342/365 |
| 2002/0000800 A1 * | 1/2002 | Hill | ........................ | G01R 23/12 324/76.82 |
| 2002/0057218 A1 * | 5/2002 | Smith | ....................... | H04B 7/10 342/365 |
| 2005/0077969 A1 * | 4/2005 | Lalt | ......................... | H03L 7/085 331/1 A |
| 2007/0129040 A1 * | 6/2007 | Adlerstein | .............. | G01S 7/032 455/260 |
| 2008/0042758 A1 * | 2/2008 | Tung | ..................... | H03L 7/0895 331/16 |
| 2008/0055010 A1 * | 3/2008 | Lerner | ................... | H03B 21/02 331/37 |
| 2009/0268791 A1 * | 10/2009 | Waheed | ................... | H03L 7/099 375/219 |
| 2010/0315170 A1 * | 12/2010 | Locascio | ................... | H03B 5/30 331/15 |
| 2011/0304365 A1 * | 12/2011 | Bunch | ................... | H03L 7/1976 327/157 |
| 2014/0077887 A1 * | 3/2014 | Huynh | ................... | H03L 7/0891 331/34 |
| 2015/0156009 A1 * | 6/2015 | Bogdan | ............... | H04L 27/2601 375/376 |
| 2015/0222274 A1 * | 8/2015 | Cenger | ..................... | H03L 7/08 327/156 |

* cited by examiner

*Primary Examiner* — Adam Houston
(74) *Attorney, Agent, or Firm* — Gregory J. Albin; Frank D. Cimino

(57) ABSTRACT

A frequency detection technique includes generating first and second signals such that a frequency of the first signal is the same as a frequency of the second signal and such that the second signal is phase-shifted by a fixed amount with respect to the first signal. The technique further includes generating a third signal having a frequency that corresponds to an absolute value of a difference between the frequency of the first signal and an integer multiple of a frequency of the reference signal. The technique further includes generating a fourth signal having a frequency that corresponds to an absolute value of a difference between the frequency of the second signal and an integer multiple of the frequency of the reference signal. The technique further includes generating an fifth signal indicative of whether a phase relationship between the third and fourth signals is a leading phase relationship, a lagging phase relationship, or an in-phase relationship.

20 Claims, 3 Drawing Sheets

FREQUENCY DETECTOR

TECHNICAL FIELD

The disclosure relates to frequency detectors, and in particular, to frequency detectors for use in frequency-locked loops and/or phase-locked loops.

BACKGROUND

Frequency-locked loops (FLLs) and phase-locked loops (PLLs) are used in a wide variety of applications, including frequency synthesizers, clock multipliers, and receivers. Some types of FLLs and PLLs use a digital frequency detector in order to assist in obtaining frequency lock. At relatively high frequencies, however, digital frequency detectors may not be able to respond fast enough in order to achieve frequency lock.

SUMMARY

According to some aspects of this disclosure, a device includes a controlled oscillator having a control input, a first output, and a second output. The device further includes a first mixer having a first input coupled to the first output of the controlled oscillator, a second input coupled to a reference signal, and an output. The device further includes a second mixer having a first input coupled to the second output of the controlled oscillator, a second input coupled to the reference signal, and an output. The device further includes a phase detector having a first input coupled to an output of the first mixer, a second input coupled to an output of the second mixer, and an output.

According to additional aspects of this disclosure, a method includes generating first and second signals such that a frequency of the first signal is the same as a frequency of the second signal and such that the second signal is phase-shifted by a fixed amount with respect to the first signal. The method further includes generating a third signal having a frequency that corresponds to an absolute value of a difference between the frequency of the first signal and an integer multiple of a frequency of the reference signal. The method further includes generating a fourth signal having a frequency that corresponds to an absolute value of a difference between the frequency of the second signal and an integer multiple of the frequency of the reference signal. The method further includes generating a fifth signal indicative of whether a phase relationship between the third and fourth signals is a leading phase relationship or a lagging phase relationship.

According to additional aspects of this disclosure, a device includes circuitry configured to generate first and second signals such that a frequency of the first signal is the same as a frequency of the second signal and such that the second signal is phase-shifted by a fixed amount with respect to the first signal. The circuitry is further configured to generate a third signal having a frequency that corresponds to an absolute value of a difference between the frequency of the first signal and an integer multiple of a frequency of the reference signal. The circuitry is further configured to generate a fourth signal having a frequency that corresponds to an absolute value of a difference between the frequency of the second signal and an integer multiple of the frequency of the reference signal. The circuitry is further configured to generate a fifth signal indicative of whether a phase relationship between the third and fourth signals is a leading phase relationship or a lagging phase relationship.

DETAILED DESCRIPTION

This disclosure describes frequency detection techniques that may be used to achieve frequency lock at relatively high frequencies in a frequency-locked loop (FLL) and/or a phase-locked loop (PLL). The frequency detection techniques may, in some examples, include converting a frequency relationship between two relatively high frequency signals and a reference signal into a phase relationship between two relatively low frequency signals, thereby allowing a relatively low frequency-constrained phase detector to be used to detect the frequency relationship between two relatively high frequency signals and a reference signal. In this way, frequency lock may be achieved for relatively high frequency signals in an FLL and/or a PLL by using a relatively low frequency-constrained phase detector.

Figure 1:
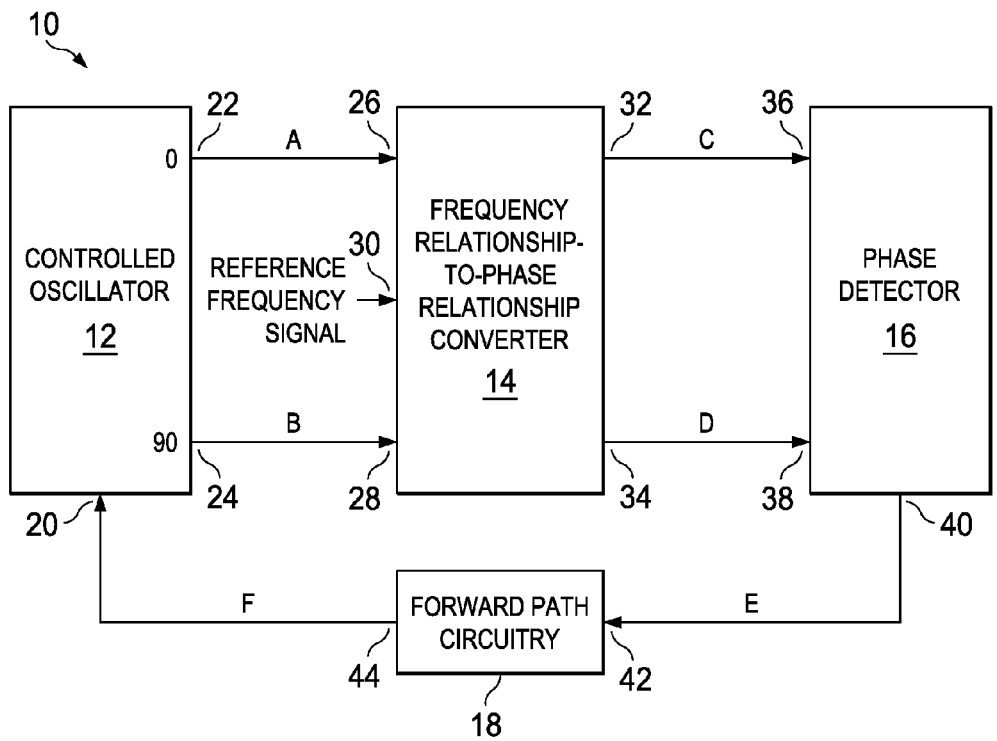
FIGS. 1-3 are signal flow diagrams illustrating example frequency-locked loops (FLLs) that include frequency detectors in accordance with this disclosure.

FIG. 1 is a signal flow diagram illustrating an example frequency-locked loop (FLL) 10 that includes a frequency detector in accordance with this disclosure. FLL 10 includes a controlled oscillator 12, a frequency relationship-to-phase relationship converter 14, a phase detector 16 and forward path circuitry 18. Frequency relationship-to-phase relationship converter 14 and phase detector 16 may form a frequency detector in accordance with this disclosure.

Controlled oscillator 12 includes a control input 20 and outputs 22, 24. Frequency relationship-to-phase relationship converter 14 includes inputs 26, 28, a reference frequency input 30, and outputs 32, 34. Phase detector 16 includes inputs 36, 38 and an output 40. Forward path circuitry 18 includes an input 42 and an output 44.

Outputs 22, 24 of controlled oscillator 12 are coupled, respectively, to inputs 26, 28 of frequency relationship-to-phase relationship converter 14. Reference frequency input 30 of frequency relationship-to-phase relationship converter 14 is coupled to a reference frequency signal. Outputs 32, 34 of frequency relationship-to-phase relationship converter 14 are coupled, respectively, to inputs 36, 38 of phase detector 16. Output 40 of phase detector 16 is coupled to input 42 of forward path circuitry 18. Output 44 of forward path circuitry 18 is coupled to control input 20 of controlled oscillator 12.

During operation, controlled oscillator 12 generates output signals A, B at outputs 22, 24, respectively. Each of output signals A, B may be a periodic signal. Controlled oscillator 12 may generate output signals A, B such that a frequency of output signal B is equal to a frequency of output signal A, and such that output signal B is phase-shifted by a fixed amount with respect to output signal A. In some examples, output signal B may be phase-shifted by 90 degrees with respect to output signal A. Controlled oscillator 12 may generate output signals A, B such that the frequency of each of output signals A, B is determined based on control signal F received at control input 20.

Frequency relationship-to-phase relationship converter 14 receives output signals A, B at inputs 26, 28, and generates signals C, D based on output signals A, B. Specifically, frequency relationship-to-phase relationship converter 14 may receive output signal A at input 26 and output signal B at input 28. Frequency relationship-to-phase relationship converter 14 may generate and output signal C at output 32 and signal D at output 34. Frequency relationship-to-phase relationship converter 14 may convert a frequency relationship between a reference signal and one or both of output signals A, B into a phase relationship, and generate signals C, D such that the phase relationship between signals C, D corresponds to and/or is indicative of the frequency relationship between the reference signal and one or both of output signals A, B.

Phase detector 16 receives signals C, D at inputs 36, 38, and generates signal E based on signals C, D. Specifically, phase detector 16 may receive signal C at input 36 and signal D at input 38, and may output signal E at output 40. Phase detector 16 may generate signal E such that signal E is indicative of a phase relationship between signals C, D. Because the phase relationship between signals C, D is indicative of the frequency relationship between the reference signal and one or both of output signals A, B, signal E may also be indicative of the frequency relationship between the reference signal and output signals A, B.

Forward path circuitry 18 is configured to generate control signal F based on signal E. In some examples, forward path circuitry 18 may include a loop filter that filters signal E to generate control signal F. In such examples, control signal F may be referred to as a filtered version of signal E. Control signal F is coupled to control input 20 of controlled oscillator 12 to control the frequency of output signals A, B.

FLL 10 may generate one or more output signals A, B based on a reference frequency signal such that the frequency of output signals A, B and the reference frequency signal have a fixed frequency relationship. For example, the frequency of output signals A, B may track the frequency of the reference frequency signal such that the frequency of output signals A, B is an integer multiple of the frequency of the reference frequency signal. In some examples, the integer multiple of the frequency of the reference frequency signal may be equal to one. In such examples, the frequency of output signals A, B is equal to the frequency of the reference frequency signal.

Example operation of FLL 10 will now be described when the frequency of output signals A, B is equal to the integer multiple of the frequency of the reference frequency signal. Because the frequency of each of output signals A, B is equal to the integer multiple of the frequency of the reference frequency signal, frequency relationship-to-phase relationship converter 14 generates signals C, D such that signals C, D have an in-phase relationship. That is, the phase of signal C equals the phase of signal D. In some examples, signals C, D may be constants (i.e., DC values), and may be said to have an in-phase relationship. Phase detector 16 generates signal E such that signal E is indicative of the in-phase relationship of signals C, D. Forward path circuitry 18 filters signal E received from phase detector 16, and generates control signal F based on signal E such that control signal F remains unchanged. This causes controlled oscillator 12 to maintain the same frequency for output signals A, B.

Example operation of FLL 10 will now be described when the frequency of output signals A, B rises above the integer multiple of the frequency of the reference frequency signal. Because the frequency of each of output signals A, B is greater than the integer multiple of the frequency of the reference frequency signal, frequency relationship-to-phase relationship converter 14 generates signals C, D such that signals C, D have a leading phase relationship. For example, signal C may lead signal D with respect to phase. Phase detector 16 generates signal E such that signal E is indicative of the leading phase relationship. Forward path circuitry 18 filters signal E received from phase detector 16, and generates control signal F based on signal E such that control signal F causes controlled oscillator 12 to decrease the frequency of output signals A, B.

Example operation of FLL 10 will now be described when the frequency of output signals A, B falls below the integer multiple of the frequency of the reference frequency signal. Because the frequency of each of output signals A, B is less than the integer multiple of the frequency of the reference frequency signal, frequency relationship-to-phase relationship converter 14 generates signals C, D such that signals C, D have a lagging phase relationship. For example, signal C may lag signal D with respect to phase. Phase detector 16 generates signal E such that signal E is indicative of the lagging phase relationship. Forward path circuitry 18 filters the signal E received from phase detector 16, and generates control signal F based on signal E such that control signal F causes controlled oscillator 12 to increase the frequency of output signals A, B.

Based on the example operation discussed above, FLL 10 may cause the frequency of output signals A, B to track the frequency of the reference frequency signal such that the frequency of output signals A, B is an integer multiple of the frequency of the reference frequency signal. If the frequency of output signals A, B were to rise above or fall below the integer multiple of the reference frequency signal, the control loop in FLL 10 may increase or decrease the frequency of output signals A, B to cause the frequency of output signals A, B to return to the target frequency.

As discussed above, the frequency of signals C, D may be less than the frequency of output signals A, B. This may allow the frequency relationship between relatively high-frequency signals (e.g., output signals A, B) and a reference frequency signal to be compared with a relatively low frequency-constrained phase detector. In this way, frequency lock may be achieved for relatively high frequency signals in an FLL 10, even in cases where the operable frequency range of phase detector 16 is limited to relatively low frequencies.

As discussed above, each of output signals A, B may be a periodic signal. Example periodic signals include sinusoidal signal, a square wave signal, a triangle wave signal, or any other type of periodic, oscillating signal. In some examples, the frequencies of output signals A, B may be greater than 100 gigahertz (GHz), and in further examples greater than 200 GHz.

In some examples, controlled oscillator 12 may be a voltage-controlled oscillator (VCO). In such examples, control signal F received by controlled oscillator 12 may be a voltage signal. In further examples, controlled oscillator 12 may be a quadrature VCO.

As discussed above, frequency relationship-to-phase relationship converter 14 may generate signals C, D such that a phase relationship between signals C, D is indicative of a frequency relationship between the reference frequency signal and one or both of output signals A, B. For example, frequency relationship-to-phase relationship converter 14 may generate signals C, D such that the phase relationship of signals C, D changes depending on whether the frequencies of output signals A, B are greater than, less than, or equal to an integer multiple of the frequency of the reference frequency signal.

The phase relationship between signals C, D may refer to whether signals C, D are in a leading phase relationship, a lagging phase relationship, or in-phase phase relationship. Signals C, D may be in a leading phase relationship when signal C leads signal D by 90 degrees (e.g., when signal C crosses zero a quarter of a period prior to signal D). Similarly, signals C, D may be in a lagging phase relationship when signal C lags signal D by 90 degrees (e.g., when signal C crosses zero a quarter of a period after signal D). Signals C, D may be in an in-phase relationship when the phases of signal C and signal D are aligned. In some cases, when signals C, D are in an in-phase relationship, signals C, D may be substantially constant.

The assignment of a leading or lagging phase relationship to whether signal C leads or lags signal D, respectively, is merely exemplary. In other examples, a leading or lagging phase relationship may be assigned to whether signal D leads or lags signal C, respectively.

In the examples described in this disclosure, the magnitude of the phase difference between signals C, D for the leading and lagging phase relationships is 90 degrees. However, in other examples, the magnitude of the phase difference may be different (e.g., 70 degrees).

The frequency relationship between the reference frequency signal and one or both of output signals A, B may refer to whether the frequency of one or both of output signals A, B is greater than, less than, or equal to an integer multiple of the frequency of the reference frequency signal. In examples where the frequencies of output signals A, B are equal, the phase relationship between signals C, D may be indicative of whether the frequencies of both of output signals A, B are greater than, less than an integer multiple of the frequency of the reference frequency signal.

In some examples, frequency relationship-to-phase relationship converter 14 may generate signals C, D such that signals C, D have a leading phase relationship when the frequencies of output signals A, B are greater than an integer multiple of the frequency of the reference frequency signal, such that signals C, D have a lagging phase relationship when the frequencies of output signals A, B are less than the integer multiple of the frequency of the reference frequency signal, and such that signals C, D have an in-phase relationship when the frequencies of output signals A, B are equal to the integer multiple of the frequency of the reference frequency signal.

In further examples, frequency relationship-to-phase relationship converter 14 may generate signals C, D such that signals C, D have a leading phase relationship when the frequencies of output signals A, B are less than an integer multiple of the frequency of the reference frequency signal, such that signals C, D have a lagging phase relationship when the frequencies of output signals A, B are greater than the integer multiple of the frequency of the reference frequency signal, and such that signals C, D have an in-phase relationship when the frequencies of output signals A, B are equal to the integer multiple of the frequency of the reference frequency signal. In some cases, when signals C, D are in an in-phase relationship, signals C, D may be substantially constant.

In some examples, the frequencies of signals C, D may be equal. In further examples, the frequencies of signals C, D may be less than the frequencies of output signals A, B. IN additional examples, signals C, D may be constants.

As discussed above, phase detector 16 may generate signal E such that signal E is indicative of the phase relationship between signals C, D. In other words, signal E may be indicative of whether signals C, D have a leading phase relationship, a lagging phase relationship, or an in-phase relationship.

In some examples, signal E may not be indicative of the magnitude of the phase relationship, but only of the polarity or quality of the phase relationship (i.e., indicative of whether the phase relationship is leading, lagging or in-phase, but not by how much). In further examples, signal E may be indicative of both the magnitude and polarity (or quality) of the phase relationship. In some examples, phase detector 16 may be a bang-bang phase detector, a type-I phase detector, a type-II phase detector, or an Exclusive-OR (XOR) gate.

In examples where forward path circuitry 18 performs loop filtering, forward path circuitry 18 may, in some examples, include a charge pump followed by a loop filter. The charge pump may perform voltage-to-current conversion prior to performing the loop filtering.

In examples where forward path circuitry 18 includes a loop filter, the loop filter may, in some examples, implement a low-pass filter function. In other words, the loop filter in forward path circuitry 18 may low-pass filter signal E to generate control signal F.

In some examples, forward path circuitry 18 may be omitted from FLL 10. In such examples, output 40 of phase detector 16 may be coupled directly to control input 20 of controlled oscillator 12.

Output signals A, B, signals C, D, and the reference frequency signal may be implemented by any combination of single-ended or differential signals. In some examples, output signals A, B, signals C, D and the reference frequency signal may be differential signals, and signals E, F may be single-ended signals.

In some examples, FLL 10 may be implemented on one or more integrated circuits that include one or more of controlled oscillator 12, frequency relationship-to-phase relationship converter 14, phase detector 16 and forward path circuitry 18.

Figure 2:
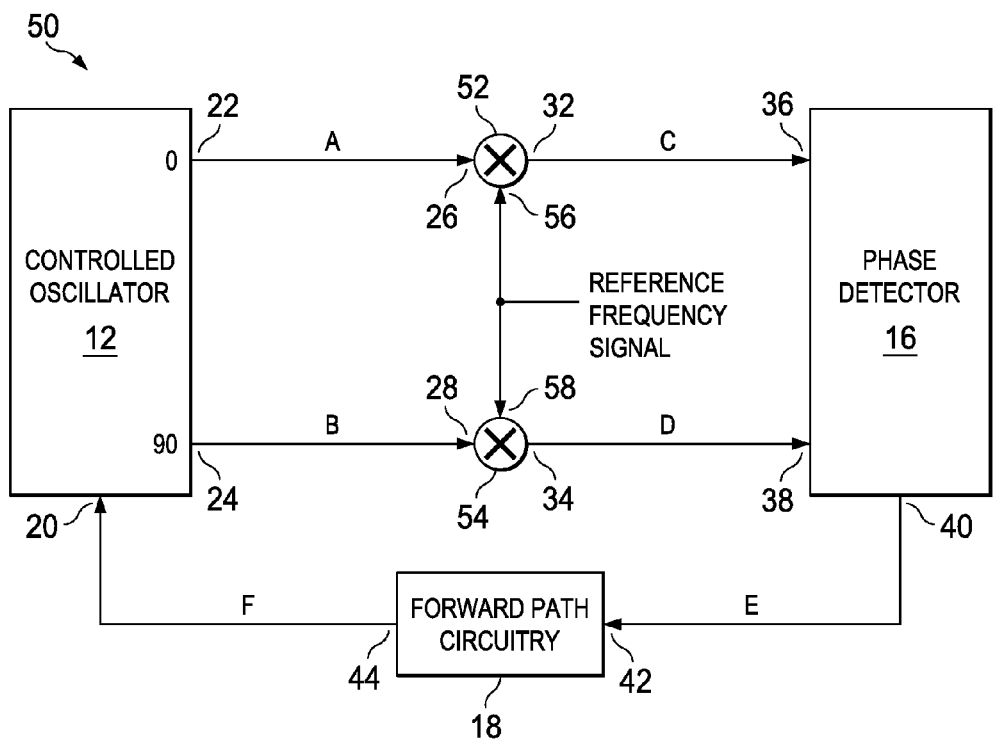

FIG. 2 is a signal flow diagram illustrating an example frequency-locked loop (FLL) that includes a frequency detector in accordance with this disclosure. In some examples, FLL 50 may be used to implement FLL 10 illustrated in FIG. 1.

FLL 50 includes similar components to those illustrated in FLL 10 of FIG. 1 except that frequency relationship-to-phase relationship converter 14 has been replaced by mixers 52, 54. In some examples, mixers 52, 54 may correspond to and be used to implement frequency relationship-to-phase relationship converter 14 illustrated in FIG. 1.

Mixer 52 includes inputs 26, 56 and an output 32. Mixer 54 includes inputs 28, 58 and an output 34. Input 26 of mixer 52 is coupled to output 22 of controlled oscillator 12. Input 28 of mixer 54 is coupled to output 24 of controlled oscillator 12. Inputs 56, 58 are coupled to the reference frequency signal. Inputs 56, 58 may collectively correspond to reference frequency input 30 of frequency relationship-to-phase relationship converter 14 shown in FIG. 1. Output 32 of mixer 52 is coupled to input 36 of phase detector 16. Output 34 of mixer 34 is coupled to input 38 of phase detector 16.

Mixer 52 may receive output signal A via input 26, the reference frequency signal via input 56, and generate signal C based on output signal A and the reference frequency signal. Mixer 52 may mix output signal A with the reference frequency signal to generate signal C. For example, mixer 52 may multiply output signal A by the reference frequency signal to generate signal C. Multiplying output signal A by the reference frequency signal to generate signal C may, in some cases, involve performing a nonlinear operation that approximates multiplication. As another example, mixer 52 may demodulate or frequency down-convert output signal A by an amount determined by an integer multiple of the reference frequency signal to generate signal C.

Mixer 54 may receive output signal B via input 28, the reference frequency signal via input 58, and generate signal D based on output signal B and the reference frequency signal. Mixer 52 may mix output signal B with the reference frequency signal to generate signal D. For example, mixer 54 may multiply output signal B by the reference frequency signal to generate signal D. Multiplying output signal B by the reference frequency signal to generate signal D may, in some cases, involve performing a nonlinear operation that approximates multiplication. As another example, mixer 54 may demodulate or frequency down-convert output signal B by an amount determined by an integer multiple of the reference frequency signal to generate signal D.

During operation, mixer 52 may generate signal C such that signal C has a frequency that corresponds to an absolute value of a difference between the frequency of output signal A and an integer multiple of the frequency of the reference frequency signal. Similarly, output 34 may generate signal D such that signal D has a frequency that corresponds to an absolute value of the difference between the frequency of output signal B and an integer multiple of the frequency of the reference frequency signal.

In some examples, the integer multiple of the frequency may be one. In further examples, the integer multiple of the frequency may be greater than one (e.g., two). In such examples, mixers 52, 54 may be subharmonic mixers.

After down-conversion of output signals A, B by mixers 52, 54, the phase relationship between signals C, D may be leading, lagging, or in-phase depending on the frequency relationship between the reference signal and one or both of output signals A, B. In this way, mixers 52, 54 operate together to convert a frequency relationship between the reference frequency signal and output signals A, B to a phase relationship between signals C, D.

Mixers 52, 54 also operate to generate signals C, D such that signals C, D have a frequency that is lower than the frequency of output signals A, B. This may allow phase detector 16 to operate at lower frequencies. In this way, frequency lock may be achieved for relatively high frequency signals in an FLL 10, even in cases where the operable frequency range of phase detector 16 is limited to relatively low frequencies.

In some examples, FLL 50 may include circuitry (e.g., controlled oscillator 12, mixers 52, 54, phase detector 16) configured to generate first and second signals (e.g. output signals A, B) such that a frequency of the first signal is the same as a frequency of the second signal and such that the second signal is phase-shifted by a fixed amount with respect to the first signal, generate a third signal (e.g., signal C) having a frequency that corresponds to an absolute value of a difference of the frequency of the first signal and an integer multiple of a frequency of the reference signal, generate a fourth signal (e.g., signal D) having a frequency that corresponds to an absolute value of a difference between the frequency of the second signal and an integer multiple of the frequency of the reference signal, and generate a fifth signal (e.g., signal E) indicative of whether a phase relationship between the third and fourth signals is a leading phase relationship, a lagging phase relationship, or an in-phase relationship.

In some examples, the circuitry may include a controlled oscillator (e.g., controlled oscillator 12) configured to generate the first and second signals, a first mixer (e.g., mixer 52) configured to generate the third signal, a second mixer (e.g., mixer 54) configured to generate the fourth signal, and a phase detector (e.g., phase detector 16) configured to generate the fifth signal.

Figure 3:
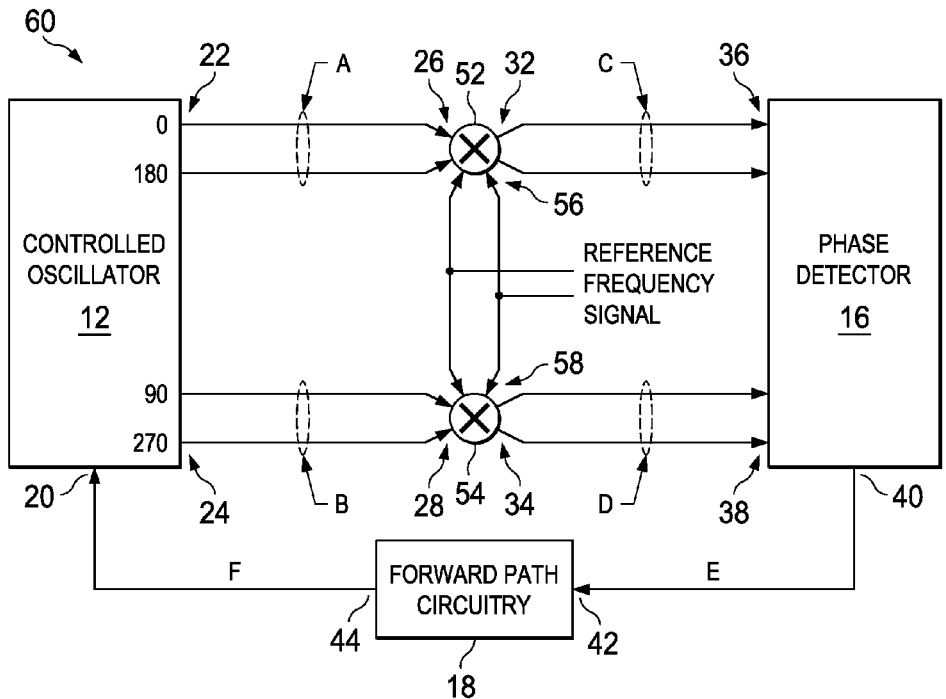

FIG. 3 is a signal flow diagram illustrating an example FLL 60 that includes a frequency detector in accordance with this disclosure. In some examples, FLL 60 may be used to implement FLL 50 illustrated in FIG. 2 and/or FLL 10 illustrated in FIG. 1.

FLL 60 includes similar components to those illustrated in FLL 50 of FIG. 2 except that: (1) output signals A, B, signals C, D and the reference frequency signal are differential signals, (2) controlled oscillator 12 is configured to generate differential signals at outputs 22, 24, and (3) mixers 52, 54 and phase detector 16 are configured to process differential signals.

As shown in FIG. 3, controlled oscillator 12 outputs two periodic signals at output 22, which may be referred to, respectively, as the 0 degree signal and the 180 degree signal. The 180 degree signal may be a phase-shifted version of the 0 degree signal. For example, the 180 degree signal may be phase shifted by 180 degrees with respect to the 0 degree signal.

Similarly, controlled oscillator 12 outputs two periodic signals at output 24, which may be referred to, respectively, as the 90 degree signal and the 270 degree signal. The 270 degree signal may be a phase-shifted version of the 90 degree signal. For example, the 270 degree signal may be phase shifted by 180 degrees with respect to the 90 degree signal.

The 90 degree signal may be phase shifted by 90 degrees with respect to the 0 degree signal. Similarly, the 270 degree signal may be phase shifted by 90 degrees with respect to the 180 degree signal.

Figure 4:
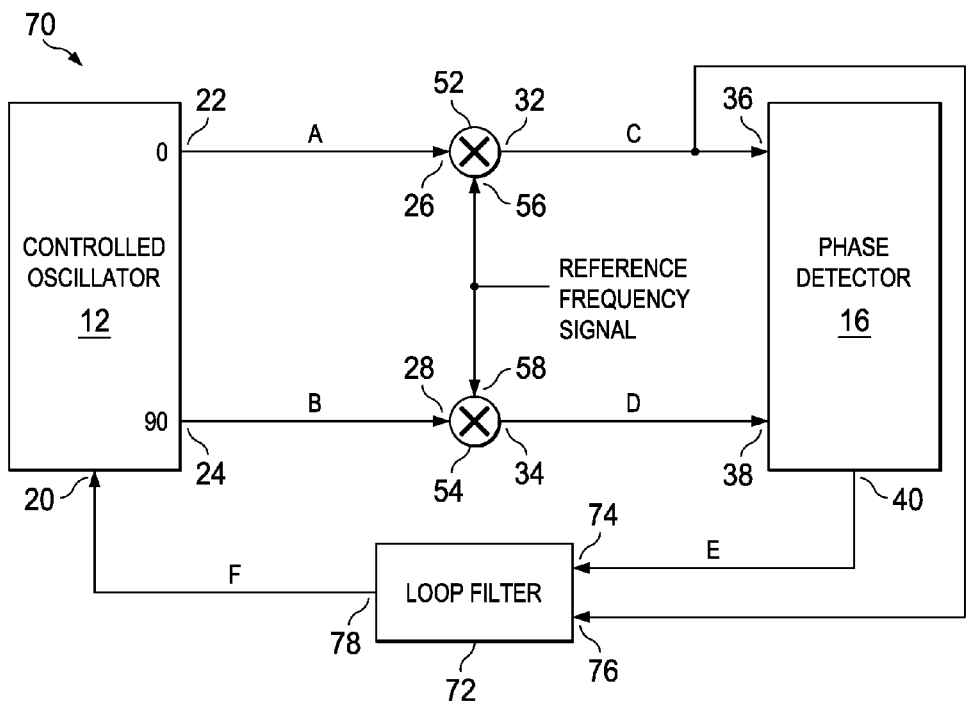
FIGS. 4 and 5 are signal flow diagrams illustrating example phase-locked loops (PLLs) that include frequency detectors in accordance with this disclosure.

FIG. 4 is a signal flow diagram illustrating an example phase-locked loop (PLL) 70 that includes a frequency detector in accordance with this disclosure. In some examples, PLL 70 may include FLL 50 illustrated in FIG. 2 and/or FLL 10 illustrated in FIG. 1. Mixers 52, 54 and phase detector 16 may form a frequency detector in accordance with this disclosure.

PLL 70 includes similar components to those illustrated in FLL 50 of FIG. 2 except that: (1) forward path circuitry 18 has been replaced by loop filter 72, and (2) loop filter 72 includes an extra input that is coupled to signal C.

Specifically, loop filter 72 includes: (1) an input 74 coupled to output 40 of phase detector 16, (2) an input 76 coupled to signal C (e.g., coupled to output 32 of mixer 52), and (3) an output 78 coupled to control input 20 of controlled oscillator 12.

Loop filter 72 may be configured such that input 74 substantially controls the value of output 78 when the deviation between the frequency of output signals A, B and the frequency of the reference frequency signal is relatively large. Loop filter 72 may be further configured such that input 76 substantially controls the value of output 78 when the deviation between the frequency of output signals A, B and the frequency of the reference frequency signal is relatively small.

In other words, PLL 70 may operate as a frequency detector when the frequency of output signals A, B deviates from the frequency of the reference frequency signal by a relatively large amount, and PLL 70 may operate as a PLL when the frequency of output signals A, B deviates from the frequency of the reference frequency signal by a relatively small amount. In this way, PLL 70 may be able to provide frequency lock and phase lock over a wide variety of input frequency ranges.

Figure 5:
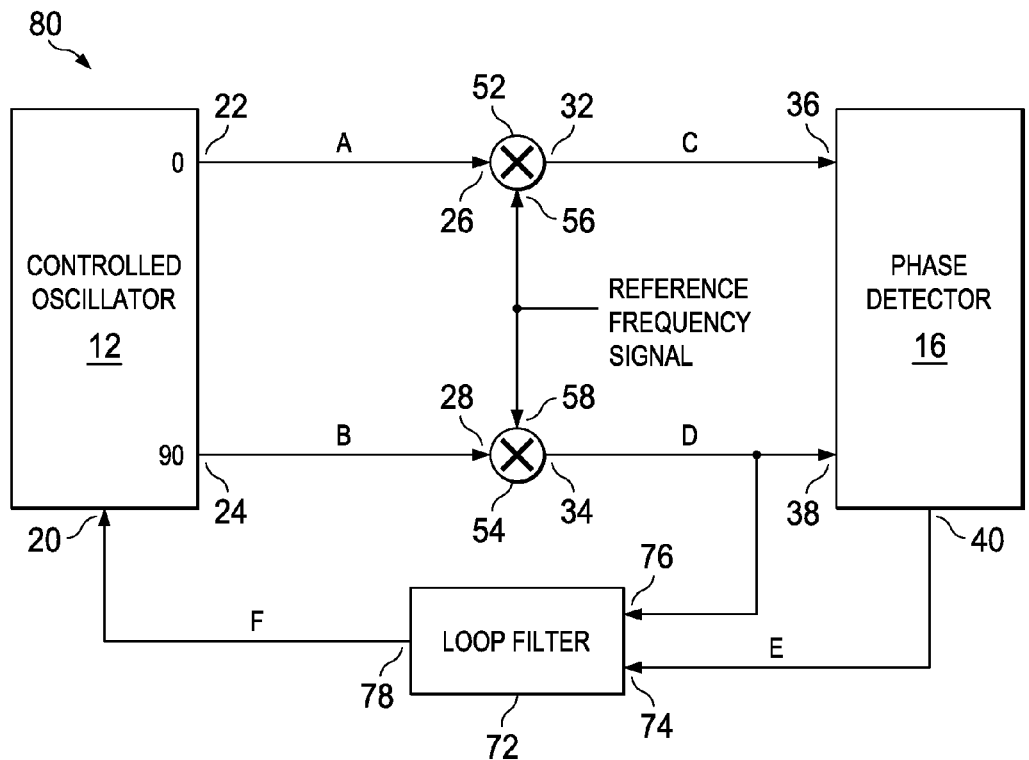

FIG. 5 is a signal flow diagram illustrating an example phase-locked loop (PLL) 80 that includes a frequency detector in accordance with this disclosure. In some examples, PLL 80 may include FLL 50 illustrated in FIG. 2 and/or FLL 10 illustrated in FIG. 1. Mixers 52, 54 and phase detector 16 may form a frequency detector in accordance with this disclosure.

PLL 80 includes similar components to those illustrated in PLL 70 of FIG. 4 except that loop filter 72 is coupled to signal D instead of signal C. Specifically, loop filter 72 includes: (1) an input 74 coupled to output 40 of phase detector 16, (2) an input 76 coupled to signal D (e.g., coupled to output 34 of mixer 58), and (3) an output 78 coupled to control input 20 of controlled oscillator 12.

Similar to PLL 70 in FIG. 4, PLL 80 may operate as a frequency detector when the frequency of output signals A, B deviates from the frequency of the reference frequency signal by a relatively large amount, and PLL 80 may operate as a PLL when the frequency of output signals A, B deviates from the frequency of the reference frequency signal by a relatively small amount. In this way, PLL 80 may be able to provide frequency lock and phase lock over a wide variety of input frequency ranges.

In some examples, the techniques of this disclosure may provide a device that includes a frequency locked loop or phase-locked loop that includes a controlled oscillator (e.g., controlled oscillator 12) having a control input (control input 20), a first output (output 22), and a second output (output 24). The device further includes a first mixer (e.g., mixer 52) having a first input (e.g., input 26) coupled to the first output of the controlled oscillator, a second input (e.g., input 56) coupled to a reference signal, and an output (e.g., output 32).

The device further includes a second mixer (e.g., mixer 54) having a first input (e.g., input 28) coupled to the second output of the controlled oscillator, a second input (e.g., input 58) coupled to the reference signal, and an output (e.g., output 34). The device further includes a phase detector (e.g., phase detector 16) having a first input (e.g., input 36) coupled to the output of the first mixer, a second input (e.g., input 38) coupled to the output of the second mixer, and an output (e.g., output 40).

In some examples, the controlled oscillator (e.g., controlled oscillator 12) is configured to generate a first signal (e.g., output signal A) at the first output of the controlled oscillator and a second signal (e.g., output signal B) at the second output of the controlled oscillator such that a frequency of the first signal is the same as a frequency of the second signal and such that the second signal is phase-shifted by a fixed amount with respect to the first signal.

In further examples, the controlled oscillator (e.g., controlled oscillator 12) is configured to generate the first and second signals (e.g., output signals A, B) such that the second signal is phase shifted by 90 degrees with respect to the first signal.

In additional examples, the controlled oscillator (e.g., controlled oscillator 12) controls a frequency of a signal (e.g., output signal A) produced at the first output and a frequency of a signal (e.g. output signal B) produced at the second output based on a signal (e.g., signal F) received at the control input (e.g., control input 20) of the controlled oscillator.

In some examples, the first mixer (e.g., output 32) is configured to generate a third signal (e.g., signal C) at the output of the first mixer such that the third signal has a frequency that corresponds to an absolute value of a difference between the frequency of the first signal and an integer multiple of a frequency of the reference signal. In such examples, the second mixer (e.g., output 34) is configured to generate a fourth signal (e.g., signal D) at the output of the second mixer such that the fourth signal has a frequency that corresponds to an absolute value of a difference between the frequency of the second signal and an integer multiple of the frequency of the reference signal. In some examples, the integer multiple of the reference signal is one.

In some examples, the first and second mixers (e.g., mixers 52, 54) are configured to generate the third and fourth signals (e.g., signals C, D) such that the third and fourth signals have a leading phase relationship, a lagging phase relationship, or an in-phase relationship depending on whether the frequency of the first and second signals (e.g. output signals A, B) is greater than, less than, or equal to the integer multiple of the frequency of the reference signal.

In further examples, the device may further include a filter (e.g., included in forward path circuitry 18) having an input (e.g., input 42) coupled to the output (e.g., output 40) of the phase detector, and an output (e.g., output 44) coupled to the control input (e.g., control input 20).

In additional examples, the filter (e.g., loop filter 72) may include a first input (e.g., input 74) coupled to the output (e.g., output 40) of the phase detector (e.g., phase detector 16), and a second input (e.g., input 76) coupled to at least one of the output of the first mixer (e.g., output 32 of mixer 52—FIG. 4) or the output of the second mixer (e.g., output 34 of mixer 54—FIG. 5).

In some examples, the controlled oscillator (e.g., controlled oscillator 12) is configured to generate a first signal (e.g. output signal A) at the first output of the controlled oscillator and a second signal (e.g., output signal B) at the second output of the controlled oscillator such that a frequency of the first signal is the same as a frequency of the second signal and such that the second signal is phase-shifted by a fixed amount with respect to the first signal. In such examples, the first mixer (e.g., mixer 52) is configured to generate a third signal (e.g., signal C) at the output of the first mixer such that the third signal has a frequency that corresponds to an absolute value of a difference between the frequency of the first signal and an integer multiple of a frequency of the reference signal, and the second mixer (e.g., mixer 54) is configured to generate a fourth signal (e.g., signal D) at the output of the second mixer such that the fourth signal has a frequency that corresponds to an absolute value of a difference between the frequency of the second signal and an integer multiple of the frequency of the reference signal, In some examples, the first and second mixers (e.g., mixers 52, 54) are configured to generate the third and fourth signals (e.g., signals C, D) such that the third and fourth signals have a leading phase relationship, a lagging phase relationship, or an in-phase relationship depending on whether the frequency of the first and second signals (e.g., output signals A, B) is greater than, less than, or equal to the integer multiple of the frequency of the reference signal. In such examples, the phase detector (e.g., phase detector 16) is configured to generate a fifth signal (e.g., signal E) indicative of whether a phase relationship between the third and fourth signals (e.g., signals C, D) is a leading phase relationship, a lagging phase relationship, or an in-phase relationship. In such examples, the controlled oscillator (e.g., controlled oscillator 12) controls a frequency of the first and second signals (e.g., output signals A, B) based on the fifth signal (e.g., signal E and/or signal F).

In some examples, the controlled oscillator (e.g. controlled oscillator 12) is a quadrature voltage-controlled oscillator, and the first and second mixers (e.g., mixers 52, 54) are subharmonic mixers. In further examples, the first, second, third, fourth, and reference signals are differential signals (e.g., output signals A, B, signals C, D, the reference frequency signal).

Figure 6:
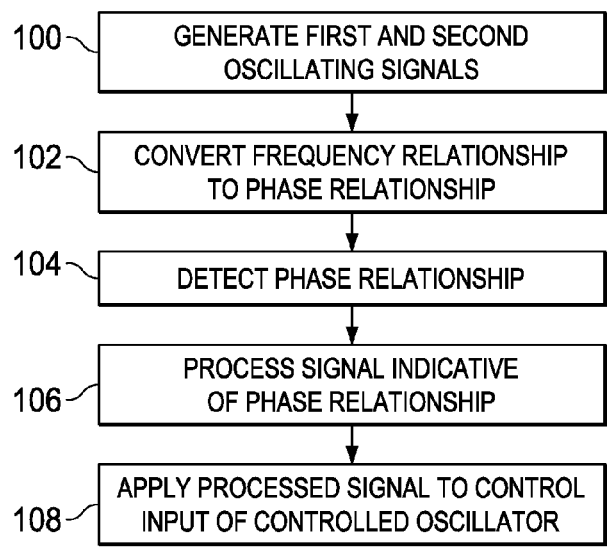
FIG. 6 is a flow diagram illustrating an example technique for performing frequency detection in an FLL or a PLL according to this disclosure.

FIG. 6 is a flow diagram illustrating an example technique for performing frequency detection in an FLL and/or a PLL according to this disclosure. The technique illustrated in FIG. 6 may be implemented in any of the circuits described in this disclosure, including the circuits illustrated in FIGS. 1-5.

Controlled oscillator 12 generates first and second oscillating signals (e.g., output signals A, B) based on a control signal received at control input 20 of controlled oscillator 12 (100). Controlled oscillator 12 may generate the first and second signals such that a frequency of the first signal is the same as a frequency of the second signal and such that the second signal is phase-shifted by a fixed amount with respect to the first signal. In some examples, controlled oscillator 12 may generate the first and second signals such that the second signal is phase shifted by 90 degrees with respect to the first signal.

Frequency relationship-to-phase relationship converter 14 converts a frequency relationship between a reference frequency signal and one or both of signals A, B into a phase relationship (102), and generates signals C, D such that the phase relationship between signals C, D corresponds to the frequency relationship between the reference frequency signal and one or both of signals A, B. In some examples, to generate signals C, D, frequency relationship-to-phase relationship converter 14 may include mixers 52, 54. Mixer 52 may generate a third signal having a frequency that corresponds to an absolute value of a difference between the frequency of the first signal and an integer multiple of a frequency of the reference signal. Mixer 54 may generate a fourth signal having a frequency that corresponds to an absolute value of a difference between the frequency of the second signal and an integer multiple of the frequency of the reference signal.

Phase detector 16 detects a phase relationship in signals C, D (104), and generates a signal (e.g., signal E) indicative of the phase relationship between signals C, D. For example, phase detector 16 may generate a signal indicative of whether a phase relationship between the third and fourth signals is a leading phase relationship, a lagging phase relationship, or an in-phase relationship.

Forward path circuitry 18 processes the signal (e.g., signal E) indicative of the phase relationship between signals C, D to generate a processed signal (e.g., control signal F) (106), and applies the processed signal to control input 20 of controlled oscillator 12 (108). In some examples, forward path circuitry 18 may include a filter, and the processed signal may be a filtered signal.

Controlled oscillator 12 may control the frequencies of the signals A, B based on signal E. In some examples, signal E may be coupled directly to control input 20 of controlled oscillator 12. In such examples, forward path circuitry 18 may filter signal E to generate a filtered signal, and controlled oscillator 12 may control the frequencies of signals A, B based on signal E by controlling the frequencies of signals A, B based on the filtered signal. In such examples, forward path circuitry 18 may, in some examples, filter signal E and at least one of signals C, D to generate the filtered signal.

This disclosure describes techniques for frequency detection that may be used in frequency locked loops. At high frequencies, it may not be possible to use some digital methods to perform frequency detection. In some examples, the techniques of this disclosure may allow frequency detection to be performed for frequencies that are above the highest frequency at which digital logic can operate. In further examples, the techniques of this disclosure may be implemented entirely or in part with analog circuitry that allows frequency detection at frequencies that are greater than 100 GHz as compared to other digital techniques. In additional examples, the techniques and/or circuitry described in this disclosure may be fully integrated. In further examples, the circuitry described in this disclosure may be able to operate up to the same frequency at which a VCO operates.

Consider an example where controlled oscillator in FIGS. 2 and 3 is a quadrature VCO and mixers 52, 54 in FIGS. 2 and 3 are subharmonic mixers. In such an example, the signals that are output by the quadrature VCO are mixed in subharmonic mixers with one or more signals having a frequency of n*Fref, where n is an integer and Fref is the frequency of the reference frequency signal. Consider a case where n=2, and Fref=80 GHz. In such a case, the steady-state output of the quadrature oscillator (Fvco) may be 160 GHz.

The signals that are output by the subharmonic mixers may change phase relative to each other depending on whether Fvco>n*Fref or Fvco<n*Fref. The signals that are output by the subharmonic mixers may have relatively low frequencies compared to the signals that are output by the quadrature VCO. The signals that are output by the sub-harmonic mixer may be fed into a phase detector to determine if Fvco>n*Fref or Fvco<n*Fref. The phase detector output signal may then be used to create a frequency locked loop.

Once frequency lock is achieved, signals generated by either of the subharmonic mixers can be used as a phase detector for a PLL. In other words, in FIG. 4, mixer 52 may operate as a phase detector for PLL 70. Similarly, in FIG. 5, mixer 54 may operate as a phase detector for PLL 80.

The techniques and circuitry described in this disclosure may, in some examples, be implemented on any combination of one or more integrated circuits. Although illustrative embodiments have been shown and described by way of example, a wide range of alternative embodiments is possible within the scope of the foregoing disclosure.

What is claimed is:

1. A device comprising:
    a controlled oscillator having:
        a control input,
        a first output, and
        a second output;
    a first mixer having:
        a first input coupled to the first output of the controlled oscillator,
        a second input coupled to a reference signal, and
        an output;
    a second mixer having:
        a first input coupled to the second output of the controlled oscillator,
        a second input coupled to the reference signal, and
        an output; and
    a phase detector having:
        a first input coupled to the output of the first mixer,
        a second input coupled to the output of the second mixer, and
        an output.

2. The device of claim 1, wherein the controlled oscillator is configured to generate a first signal at the first output of the controlled oscillator and a second signal at the second output of the controlled oscillator such that a frequency of the first signal is the same as a frequency of the second signal and such that the second signal is phase-shifted by a fixed amount with respect to the first signal.

3. The device of claim 2, wherein the controlled oscillator is configured to generate the first and second signals such that the second signal is phase shifted by 90 degrees with respect to the first signal.

4. The device of claim 1, wherein controlled oscillator controls a frequency of a signal produced at the first output of the controlled oscillator and a frequency of a signal produced at the second output of the controlled oscillator based on a signal received at the control input of the controlled oscillator.

5. The device of claim 1,
    wherein the first mixer is configured to receive a first signal at the first input of the first mixer, and generate a third signal at the output of the first mixer such that the third signal has a frequency that corresponds to an absolute value of a difference between a frequency of the first signal and an integer multiple of a frequency of the reference signal, and wherein the second mixer is configured to receive a second signal at the first input of the second mixer, and generate a fourth signal at the output of the second mixer such that the fourth signal has a frequency that corresponds to an absolute value of a difference between a frequency of the fourth signal and the integer multiple of the frequency of the reference signal.

6. The device of claim 5, wherein the integer multiple of the reference signal is one.

7. The device of claim 5, wherein the first and second mixers are configured to generate the third and fourth signals such that the third and fourth signals have a leading phase relationship, a lagging phase relationship, or an in-phase relationship depending on whether the frequency of the first and second signals is greater than, less than, or equal to the integer multiple of the frequency of the reference signal.

8. The device of claim 1, further comprising:
a filter having:
an input coupled to the output of the phase detector; and
an output coupled to the control input of the controlled oscillator.

9. The device of claim 8,
wherein the input of the filter is a first input, and
wherein the filter further comprises a second input coupled to at least one of the output of the first mixer or the output of the second mixer.

10. The device of claim 1,
wherein the controlled oscillator is configured to generate a first signal at the first output of the controlled oscillator and a second signal at the second output of the controlled oscillator such that a frequency of the first signal is the same as a frequency of the second signal and such that the second signal is phase-shifted by a fixed amount with respect to the first signal,
wherein the first mixer is configured to generate a third signal at the output of the first mixer such that the third signal has a frequency that corresponds to an absolute value of a difference between the frequency of the first signal and an integer multiple of a frequency of the reference signal,
wherein the second mixer is configured to generate a fourth signal at the output of the second mixer such that the fourth signal has a frequency that corresponds to an absolute value of a difference between the frequency of the second signal and an integer multiple of the frequency of the reference signal,
wherein the first and second mixers are configured to generate the third and fourth signals such that the third and fourth signals have a leading phase relationship, a lagging phase relationship, or an in-phase relationship depending on whether the frequency of the first and second signals is greater than, less than, or equal to the integer multiple of the frequency of the reference signal,
wherein the phase detector is configured to generate a fifth signal indicative of whether a phase relationship between the third and fourth signals is a leading phase relationship, a lagging phase relationship, or an in-phase relationship, and
wherein controlled oscillator controls a frequency of the first and second signals based on the fifth signal.

11. The device of claim 1, wherein the controlled oscillator is a quadrature voltage-controlled oscillator, and wherein the first and second mixers are subharmonic mixers.

12. The device of claim 1, wherein the first, second, third, fourth, and reference signals are differential signals.

13. A method comprising:
generating first and second signals such that a frequency of the first signal is the same as a frequency of the second signal and such that the second signal is phase-shifted by a fixed amount with respect to the first signal;
generating a third signal having a frequency that corresponds to an absolute value of a difference between the frequency of the first signal and an integer multiple of a frequency of the reference signal;
generating a fourth signal having a frequency that corresponds to an absolute value of a difference between the frequency of the second signal and an integer multiple of the frequency of the reference signal; and
generating a fifth signal indicative of whether a phase relationship between the third and fourth signals is a leading phase relationship, a lagging phase relationship, or an in-phase relationship.

14. The method of claim 13, wherein generating the first and second signals comprises generating the first and second signals such that the second signal is phase shifted by 90 degrees with respect to the first signal.

15. The method of claim 13, wherein generating the first and second signals comprises controlling the frequencies of the first and second signals based on the fifth signal.

16. The method of claim 15, further comprising:
filtering the fifth signal to generate a filtered fifth signal,
wherein controlling the frequencies of the first and second signals based on the fifth signal comprises controlling the frequencies of the first and second signals based on the filtered fifth signal.

17. The method of claim 16, wherein filtering the fifth signal comprises:
filtering the fifth signal and at least one of the third signal or fourth signal to generate the filtered signal.

18. The method of claim 13, wherein the first, second, third, fourth, and reference signals are differential signals.

19. A device comprising circuitry configured to:
generate first and second signals such that a frequency of the first signal is the same as a frequency of the second signal and such that the second signal is phase-shifted by a fixed amount with respect to the first signal;
generate a third signal having a frequency that corresponds to an absolute value of a difference between the frequency of the first signal and an integer multiple of a frequency of the reference signal;
generate a fourth signal having a frequency that corresponds to an absolute value of a difference between the frequency of the second signal and an integer multiple of the frequency of the reference signal; and
generate a fifth signal indicative of whether a phase relationship between the third and fourth signals is a leading phase relationship, a lagging phase relationship, or an in-phase relationship.

20. The device of claim 19, wherein the circuitry comprises:
a controlled oscillator configured to generate the first and second signals;
a first mixer configured to generate the third signal;
a second mixer configured to generate the fourth signal; and
a phase detector configured to generate the fifth signal.

* * * * *